(12) United States Patent
Lambrecht

(10) Patent No.: US 7,477,883 B2
(45) Date of Patent: Jan. 13, 2009

(54) RECEIVER FRONT-END SENSITIVITY BOOSTER

(75) Inventor: Xavier Jean Francois Lambrecht, Romsee (BE)

(73) Assignee: NXP B.V., Eindhoven (NL)

( * ) Notice: Subject to any disclaimer, the term of this patent is extended or adjusted under 35 U.S.C. 154(b) by 133 days.

(21) Appl. No.: 10/552,831

(22) PCT Filed: Mar. 22, 2004

(86) PCT No.: PCT/IB2004/001073

§ 371 (c)(1),
(2), (4) Date: Mar. 8, 2007

(87) PCT Pub. No.: WO2004/093313

PCT Pub. Date: Oct. 28, 2004

(65) Prior Publication Data

US 2007/0262821 A1      Nov. 15, 2007

(30) Foreign Application Priority Data

Apr. 17, 2003   (EP) ................................. 03101059

(51) Int. Cl.
*H04B 1/16* (2006.01)
(52) U.S. Cl. ..................................... 455/245.2; 455/254
(58) Field of Classification Search .............. 455/232.1, 455/234.1, 245.2, 249.1, 250.1, 251.1, 253.2, 455/254

See application file for complete search history.

(56) References Cited

U.S. PATENT DOCUMENTS 6,118,499 A * 9/2000 Fang .......................... 348/726
6,181,201 B1 * 1/2001 Black ......................... 330/129
6,498,927 B2 * 12/2002 Kang et al. ............... 455/245.2
6,657,678 B1 * 12/2003 Mizukami et al. ........... 348/726
6,934,522 B2 * 8/2005 Konishi et al. ........... 455/245.1

* cited by examiner

*Primary Examiner*—Blane J Jackson

(57) ABSTRACT

The invention relates to a method for increasing the sensitivity of a chain of amplifiers that comprises the steps of amplifying a signal by means of a first amplifier with a gain factor $A_1=A_{1,m}*\Delta A_1$, where $A_{1,m}$ denotes a constant gain factor and $A_1$ denotes a gain factor variation with $1 \leq A_{1,min} \leq A_1 \leq A_{1,max}$, further amplifying the signal by means of a second amplifier with a controllable gain factor $A_2 \leq A_{2,max}$, where variations $A_1$ of the gain of the first amplifier are compensated by reducing the gain $A_2$ of the second amplifier, so that the difference between the chain gain factor $A_C=A_1*A_2$ and a target chain gain factor $A_T \leq A_{T,max}$ becomes zero. To solve the object of the invention to provide a method for increasing the sensitivity of a chain of amplifiers that suffers from gain factor variations, it is proposed that that the signal at the output of the second amplifier is additionally fed into a divider that applies a fixed factor $A_3 \leq 1$ to its input, that variations $A_1$ of the gain factor $A_1$ of the first amplifier as well as the fixed factor $A_3$ are at least partially compensated by the gain factor $A_2$ of the second amplifier, so that the difference between the chain gain factor $A_C'=A_1*A_2*A_3$ and the target chain gain factor $A_T$ becomes minimum, and that the fixed factor $A_3$ is chosen so that there exist at least some combinations of values $A_1$ and $A_T$ for which said difference can be forced to zero, and some combinations of values $A_1$ and $A_T$, for which said difference can no longer be forced to zero due to the limitation $A_2 \leq A_{2,max}$. The invention further relates to a device for increasing the sensitivity of a chain of amplifiers.

10 Claims, 4 Drawing Sheets

RECEIVER FRONT-END SENSITIVITY BOOSTER

The invention relates to a method for increasing the sensitivity of a chain of amplifiers that comprises the steps of amplifying a signal by means of a first amplifier with a gain factor $A_1 = A_{1,m} * \Delta A_1$, where $A_{1,m}$ denotes a constant gain factor and $\Delta A_1$ denotes a gain factor variation with $1 \leq \Delta A_{1,min} \leq \Delta A_1 \leq \Delta A_{1,max}$, further amplifying the signal by means of a second amplifier with a controllable gain factor $A_2 \leq A_{2,max}$, where variations $\Delta A_1$ of the gain of the first amplifier are compensated by reducing the gain $A_2$ of the second amplifier, so that the difference between the chain gain factor $A_C = A_1 * A_2$ and a target chain gain factor $A_T \leq A_{T,max}$ becomes zero. The invention further relates to a device for increasing the sensitivity of a chain of amplifiers.

In a variety of application fields of signal transmission, such as e.g. cable or broadcast radio and television, information-carrying baseband signals are transmitted as bandpass signals (also denoted as Radio Frequency (RF) signals) in higher frequency ranges (at RF frequencies). The reasons for RF transmission are manifold: Higher frequency ranges are usually more suitable for signal transmission via space or via transmission lines that are shared among several transmitters and receivers; the shift of the frequency range allows for the application of various modulation techniques that can be adapted to the characteristics of the transmission channel (space or cable); the spectrum of the information-carrying baseband signals can be modified by the frequency transformation to allow for a more efficient use of the available transmission bandwidth (spreading or compression of the spectrum); Frequency Division Multiplex (FDM) can be applied by transmitting the information-carrying baseband signals of several information sources in adjacent high frequency bands (frequency channels), where each frequency channel has the same bandwidth, but different carrier frequencies (the carrier frequency then denotes the centre frequency of the carrier wave, a sinusoid, whose amplitude, phase or frequency is modulated by the information-carrying baseband signals).

Figure 1:
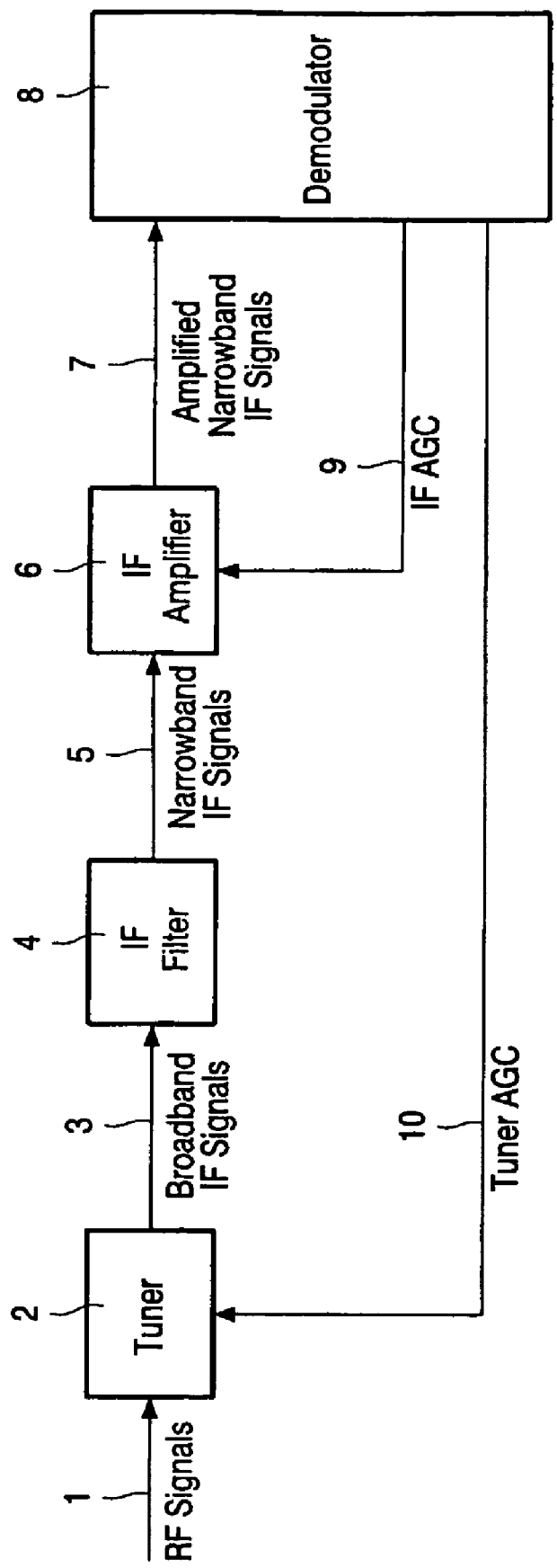

FIG. 1 depicts the basic set-up of a state-of-the-art receiver for RF signals in a television broadcast system with FDM. The same receiver structure is disclosed in prior art document EP 0 838 896 A2, where it is used in the context of radio communication. Due to FDM, the RF signal 1 contains the information of all transmitted frequency channels, which are separated in the frequency domain. In order to be able to retrieve the information of one specific frequency channel, inter alia down-conversion (frequency reduction) of the RF signal 1, possibly via one or several Intermediate Frequencies (IF), is required. This down-conversion process is generally performed by a tuner 2, which additionally applies a bandpass filter centred at the carrier frequency of the desired frequency channel to remove the influence of noise and of adjacent frequency channels. A further task of the tuner is to amplify the received RF signal, which in general is highly attenuated due to signal transmission loss occurring in wireless or cable-bound transmission. At the output of the tuner, a broadband IF signal 3 is present. To further suppress signals of adjacent frequency channels in the broadband IF signal 3, which can not be perfectly removed by the bandpass filter of the tuner 2 alone, a narrowband IF filter 4 with approximately the bandwidth of the desired frequency channel is used to produce the narrowband IF signal 5. Unfortunately, such filters cause high attenuation of the narrowband IF signal 5, so that at the output of the IF filter 4, an IF amplifier 6 is provided that outputs the amplified narrowband IF signal 7. The narrowband IF signal 7 then is fed into a demodulator 8 to recover the originally transmitted information-carrying baseband signal. For the demodulator to work properly, a constant signal level of the amplified narrowband IF signal 7 at the input of the demodulator is required, which is controlled by the IF amplifier 6 and the amplifier of the tuner 2 by means of two Automatic Gain Control (AGC) loops 9 and 10, respectively. According to prior art document EP 0 838 896 A2, these AGC loops preferably keep the gain of the tuner at its maximum value and control the signal level of the signal at the input of the demodulator by varying the gain of the IF amplifier.

The sensitivity of a reception system is characterised by the minimum signal level (with a fixed Signal-to-Noise Ratio (SNR)) that the reception chain is able to cope with. The weaker the signal, the better the reception chain. The minimum signal level depends on the quality, i.e. the noise performance in terms of the noise figure, of the reception chain components. Every component in the reception chain will add noise to the incoming RF signal, deteriorating the overall SNR. The demodulator 8 needs a minimum given SNR and a constant signal level of its input signal to operate properly.

The tuner 2 is characterised by its noise figure and gain. The gain is controllable to allow for application of an AGC loop 10. The maximum gain provided by the tuner strongly depends both on the frequency and on the manufacturing process. It can for instance be characterised by a statistical value with expectation value and standard deviation. The noise figure of the tuner is minimum when the gain of the tuner is maximum.

The IF filter 4 is characterised by its noise figure and gain. If a passive Surface Acoustic Wave (SAW) filter is applied as IF filter, the noise figure is equal to the loss of the filter.

The IF amplifier 6 is characterised by its noise figure and gain. The gain is controllable and dictated by the AGC loop 9. As for the amplifier of the tuner, the noise figure of the IF amplifier is minimum when the gain of the IF amplifier is maximum.

The specification of the above-described RF reception chain and the functionality of the AGC loops 9 and 10 will be explained in the following. Assuming the signal level of the RF signal 1 to be in the range [45 dB μV, 75 dB μV], the loss of the IF filter 4 to amount 18 dB (corresponding to a gain of −18 dB) and the desired signal level of the amplified narrowband IF signal 7 at the input of the demodulator 8 to equal 114 dB μV, the tuner 2 and the IF amplifier 6 must share a gain in the range [57 dB, 87 dB]. Furthermore, if the gain of the tuner 2 is in the range [41 dB, 49 dB] due to its statistical nature, to achieve the desired signal level at the input of the demodulator 8, an IF amplifier 6 with a maximum gain at least equal to 87 dB−41 dB=46 dB is required. In the following, the use of an IF amplifier 6 with 50 dB maximum gain is assumed.

Figure 2:
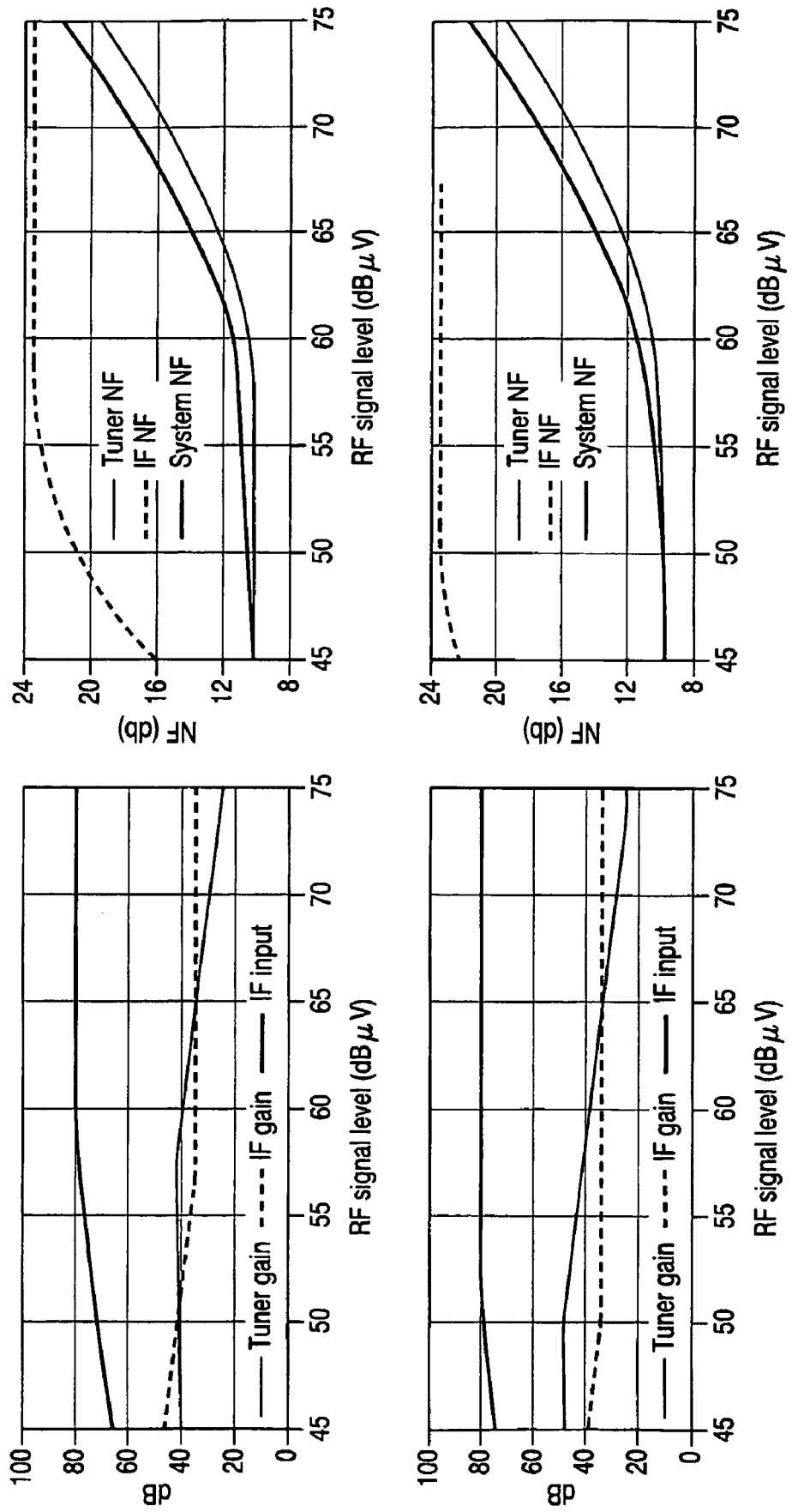

The functionality of the AGC control loops 9 and 10 for this specification is depicted in FIG. 2. In the left graphs, the gain of the tuner 2, the gain of the IF amplifier 6 and the signal level of the narrowband IF signals 5 at the input of the IF amplifier 6 are depicted (in dB) as a function of the signal level of the RF signal 1. In the right graphs, the corresponding noise figures (in dB) of the tuner 2, the IF amplifier 6 and the entire reception chain are depicted as a function of the signal level of the RF signal 1.

Consider the two upper graphs, which are indicative of the case where the maximum gain of the tuner 2 takes its minimum value of 41 dB. To achieve optimum performance of the receiver chain, according to the chain noise rule especially the first amplifier in the chain, i.e. the amplifier in the tuner 2, is required to have a low noise figure. This is achieved when the tuner is operated with maximum gain. For increasing signal levels of the received RF signal 1 (lying within the range [45 dB μV, 75 dB μV]), as indicated by the abscissa of the two upper graphs in FIG. 2, and a desired fixed level of the amplified narrowband IF signal 7, the gain of the tuner 2 thus is kept constant, and the increasing signal level of the RF signal is compensated by reducing the gain of the IF amplifier 6 within the AGC loop 9 of the IF amplifier 6. However, with increasing signal level of the RF signal 1 and fixed gain of the tuner 2, a point will be reached where the signal level of the broadband IF signal 3 at the output of the tuner 2 exceeds its dedicated dynamic range. This point is denoted as take-over point. To prevent this exceeding of the dynamic range, beyond the take over point, the AGC loop 10 of the tuner 2 starts to reduce the gain of the tuner below its maximum value, whereas the AGC loop 9 of the IF amplifier 6 keeps the gain of the IF amplifier fixed. In the two upper graphs of FIG. 2, this take-over point occurs at 58 dB μV.

Whereas the upper graphs in FIG. 2 cover the case where the gain of the tuner 2 takes its minimum value of the maximum gain, 41 dB, the lower graphs in FIG. 2 are indicative of the case where the tuner 2 takes its maximum value of the maximum gain, 49 dB.

The resulting 8 dB excess gain, which are not required by the receiver chain because it was specified for the case where the tuner maximum gain takes its minimum value (41 dB), have to be compensated by the IF amplifier, so that the IF amplifier gain in the left lower graph starts with a gain of 38 dB instead of the 46 dB in the left upper graph. As is clearly visible by comparing the values of the IF amplifier noise figure in the upper and lower right graphs of FIG. 2, in the case of the tuner having its minimum possible maximum gain of 41 dB (upper right graph), the IF amplifier noise figure takes its maximum value much later than in the case of the tuner having its maximum possible maximum gain of 49 dB (lower right graph), in correspondence with the two different take-over points.

As can be seen by comparing the chain noise figures of the entire reception chain for the two different maximum gains of the tuner, the system noise figure of the entire reception chain is only slightly degraded in the case of a maximum tuner gain of 49 dB as compared to the case of 41 dB. This is mainly due to the chain noise rule stating that the chain noise figure is mainly affected by the noise figure of the first amplifier (in this case the tuner). However, the IF amplifier 6 also generates noise outside the channel bandwidth, i.e. outside the bandwidth that is defined by the bandwidth of the IF filter 4. As for the noise level of the "in-channel" noise, the noise level of this "out-of-channel" noise directly depends on the noise figure of the IF amplifier 6. At the input of the demodulator, the input bandwidth of which generally is significantly larger that the channel bandwidth, the "out-of-channel" and "in-channel" noise are integrated over the input bandwidth of the demodulator, and not only over the bandwidth of the channel. For large input bandwidths of the demodulator 8 and large noise figures of the IF amplifier 6, the SNR at the input of the demodulator 8 then degrades significantly. It is thus noted that the noise figure of the IF amplifier 6, although being of minor importance for the system chain noise figure, via the "out-of-channel" noise significantly influences the SNR of the demodulator and has to be considered in the specification of an RF receiver. This is especially the case when, as in the above example, in a chain of amplifiers gain variations of the first amplifier have to be compensated by reducing the gain of the second amplifier, where, although the chain noise figure remains basically unchanged, the SNR and the at the end of the chain significantly degrades due to the increase of the noise figure of the second amplifier. The SNR degradation corresponds to a decreased sensitivity of the amplifier chain.

Derived from this specific application field of an RF receiver, it is thus the general object of the invention to provide a method for increasing the sensitivity of a chain of amplifiers that suffers from gain factor variations.

To solve the object of the invention, a method for increasing the sensitivity of a chain of amplifiers is proposed that comprises the steps of amplifying a signal by means of a first amplifier with a gain factor $A_1=A_{1,m}*\Delta A_1$, where $A_{1,m}$ denotes a constant gain factor and $\Delta A_1$ denotes a gain factor variation with $1 \leq \Delta A_{1,min} \leq \Delta A_1 \leq \Delta A_{1,max}$, further amplifying the signal by means of a second amplifier with a controllable gain factor $A_2 \leq A_{2,max}$, where variations $\Delta A_1$ of the gain of the first amplifier are compensated by reducing the gain $A_2$ of the second amplifier, so that the difference between the chain gain factor $A_C=A_1*A_2$ and a target chain gain factor $A_T \leq A_{T,max}$ becomes zero, characterised in that the signal at the output of the second amplifier is additionally fed into a divider that applies a fixed factor $A_3 \leq 1$ to its input, that variations $\Delta A_1$ of the gain factor $A_1$ of the first amplifier as well as the fixed factor $A_3$ are at least partially compensated by the gain factor $A_2$ of the second amplifier, so that the difference between the chain gain factor $A_C'=A_1*A_2*A_3$ and the target chain gain factor $A_T$ becomes minimum, and that the fixed factor $A_3$ is chosen so that there exist at least some combinations of values $\Delta A_1$ and $A_T$ for which said difference can be forced to zero, and some combinations of values $\Delta A_1$ and $A_T$, for which said difference can no longer be forced to zero due to the limitation $A_2 \leq A_{2,max}$.

The incorporation of the divider, which multiplies the signal level and the noise level by the same factor $A_3 \leq 1$, allows to shift the operating point of the second amplifier, so that the effective gain of the combination of the second amplifier and the divider may equal the gain of a stand-alone amplifier, but whereas due to the fact that the noise figure of an amplifier decreases with increasing gain, the effective noise figure of the combination may be substantially lower as the noise figure of a stand-alone amplifier. The divider thus offers an additional degree of freedom in fixing the operational point of the second amplifier, especially with respect to its noise figure that influences both the "in-channel" and the "out-of-channel" noise. Of course, the incorporation of the divider reduces the overall achievable gain of the amplifier chain, so that, depending on the desired target chain factor $A_T$ and the value $\Delta A_1$, the desired target chain factor no longer can be achieved. However, the reduction of the achievable gain may be traded against the reduction of the second amplifier's noise figure, which has minor importance for the chain noise factor, but major importance for the "out-of-channel" noise that may degrade the SNR of the signal at the output of the divider. A further advantage of the incorporation of the divider is the possibility to optimise the output load of the IF amplifier by properly designing the elements of the divider. An optimisation of the IF amplifier output load leads to reduced distortions in the output signals of the IF amplifier.

According to the present invention, it is advantageous that said factor $A_3$ is chosen so that said difference can be forced to zero for large values of the variation $\Delta A_1$ and/or small values $A_T$, and that said difference can no longer be forced to zero for small values of the variation $\Delta A_1$ and/or large values $A_T$.

According to the present invention, it is preferred that said fixed factor $A_3$ is further chosen so that for a group of target chain gain factors $A_T$, the second amplifier works with a gain factor $A_2$ that is close to its maximum gain factor $A_{2,max}$, that for said group of target chain gain factors, the greatest possible independence of the gain factor $A_2$ from the variation $\Delta A_1$ is achieved and that a certain difference between the chain gain factor $A_C'$ and the target chain gain factor $A_T$ is accepted especially for smaller values of $\Delta A_1$. When the gain factor $A_2$ is close to its maximum, the noise figure of the second amplifier is accordingly reduced, and the combination of second amplifier and divider achieves a reduced effective noise figure as compared to a stand-alone amplifier with the same effective gain. The price to be paid for this optimum operating point of the second amplifier is the reduction of the chain gain below its target value $A_T$, especially for small variations $\Delta A_1$.

A preferred embodiment of the method according to the present invention is characterised in that the gain factor $A_1$ defines the product between the maximum gain factor of a tuner that down-converts a modulated Radio Frequency (RF) signal to a broadband Intermediate Frequency (IF) signal and the gain factor of an IF filter that transforms the broadband IF signal into a narrowband IF signal, where the gain factor of the IF filter is fixed and the maximum gain factor of the tuner varies, and that the gain factor $A_2$ represents the gain factor of an IF amplifier that amplifies the narrowband IF signal to produce an amplified narrowband IF signal that is fed into a demodulation instance to produce a demodulated signal.

According to the preferred embodiment of the method of the present invention it is advantageous that said at least partial compensation of said variations $\Delta A_1$ of the gain factor of the first amplifier as well as of said fixed factor $A_3$ of the divider by controlling the gain factor $A_2$ of the second amplifier to achieve a minimum difference between the chain gain factor $A_C'=A_1*A_2*A_3$ and the target chain gain factor $A_T$ represents a part of one out of the two steps of a joint control of the gains of the tuner and the IF amplifier, which is performed in order to force the signal level of the amplified narrowband IF signal at the input of the demodulator to a constant target value, where for steadily increasing RF signal levels said two steps are defined as: a first step of keeping the gain factor of the tuner at its maximum value and varying the gain factor of the IF amplifier so that the difference between the chain gain factor $A_C'=A_1*A_2*A_3$ and the target chain gain factor $A_T$, which steadily reduces with the steadily increasing RF signal levels, becomes minimum, until the broadband IF signal exceeds a dedicated dynamic range at a take-over point, and a second step of not further reducing the gain factor $A_2$ from said take-over point on and starting to steadily reduce the gain factor of the tuner below its maximum value instead.

According to the preferred embodiment of the method of the present invention, it is preferred that for said combinations of values $\Delta A_1$ and $A_T$, for which said difference between the chain gain factor $A_C'$ and the target chain gain factor $A_T$ can no longer be forced to zero due to the limitation $A_2 \leq A_{2,max}$ and the signal level of the amplified narrowband IF signal at the input of the demodulator falls below the constant target value accordingly, the degradation of the quality of the demodulated signal compared to the case when said difference can be forced to zero is insignificant.

The object of the invention is further solved by a device for reducing the noise figure of a chain of amplifiers, comprising a first amplifier for amplifying a signal by a gain factor $A_1=A_{1,m}*\Delta A_1$, where $A_{1,m}$ denotes a constant gain factor and $\Delta A_1$ denotes a gain factor variation with $1 \leq \Delta A_{1,min} \leq \Delta A_1 \leq \Delta A_{1,max}$, a second amplifier for further amplifying the signal by a controllable gain factor $A_2 \leq A_{2,max}$, where the second amplifier compensates the variations $\Delta A_1$ of the gain of the first amplifier, so that the difference between the chain gain factor $A_C=A_1*A_2$ and a target chain gain factor $A_T \leq A_{T,max}$ becomes zero, characterised in that the device further comprises a divider that is arranged behind the second amplifier and applies a fixed factor $A_3<1$ to its input, where the second amplifier at least partially compensates the variations $\Delta A_1$ of the gain factor $A_1$ of the first amplifier as well as the fixed factor $A_3$, so that the difference between the chain gain factor $A_C'=A_1*A_2*A_3$ and the target chain gain factor $A_T$ becomes minimum, and where the fixed factor $A_3$ is chosen so that there exist at least some combinations of values $\Delta A_1$ and $A_T$ for which said difference can be forced to zero, and some combinations of values $\Delta A_1$ and $A_T$, for which said difference can no longer be forced to zero due to the limitation $A_2 \leq A_{2,max}$.

A preferred embodiment of a device according to the present invention is characterised in that the first amplifier represents both a tuner that down-converts a modulated Radio Frequency (RF) signal to a broadband Intermediate Frequency (IF) signal and an IF filter that transforms the broadband IF signal into a narrowband IF signal, where the gain factor of the IF filter is fixed and the maximum gain factor of the tuner varies, and that the second amplifier represents an IF amplifier that amplifies the narrowband IF signal to produce an amplified narrowband IF signal that is fed into a demodulation instance to produce a demodulated signal.

According to the preferred embodiment of a device of the present invention, said divider can be a voltage divider.

Figure 3:
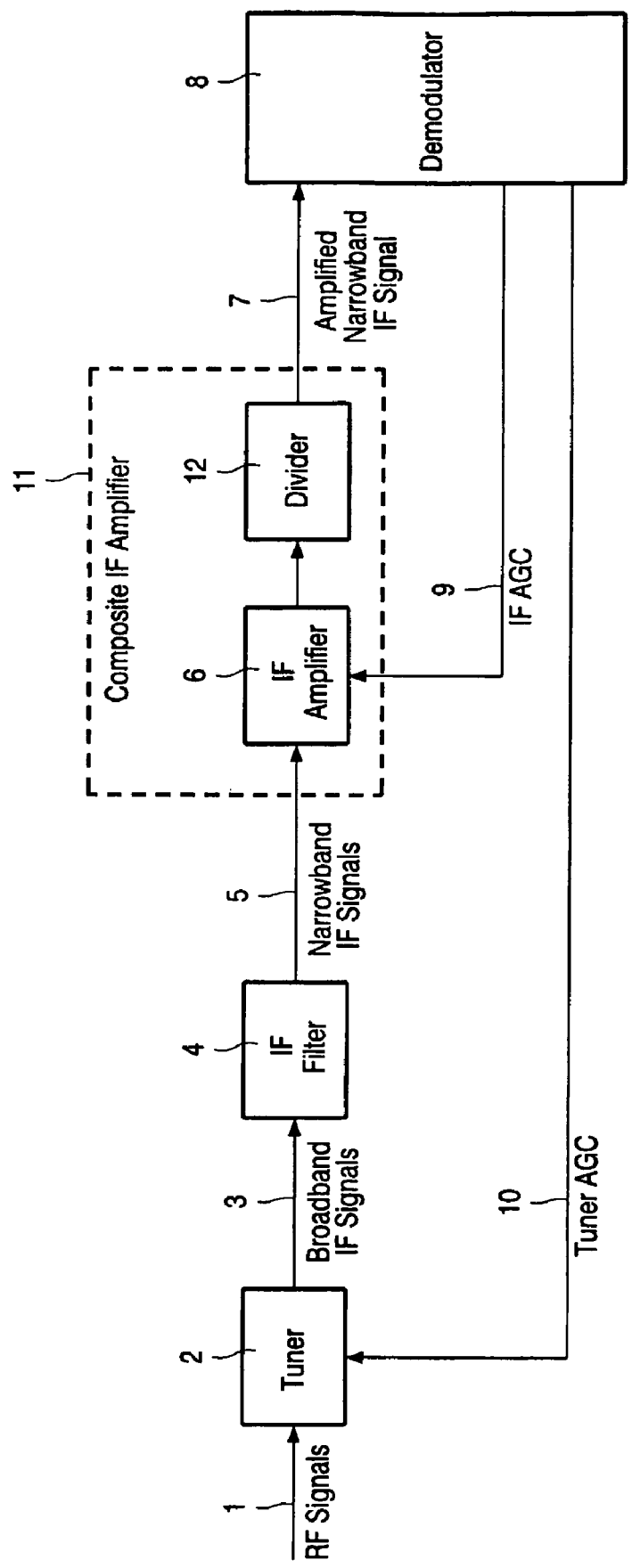
Figure 4:
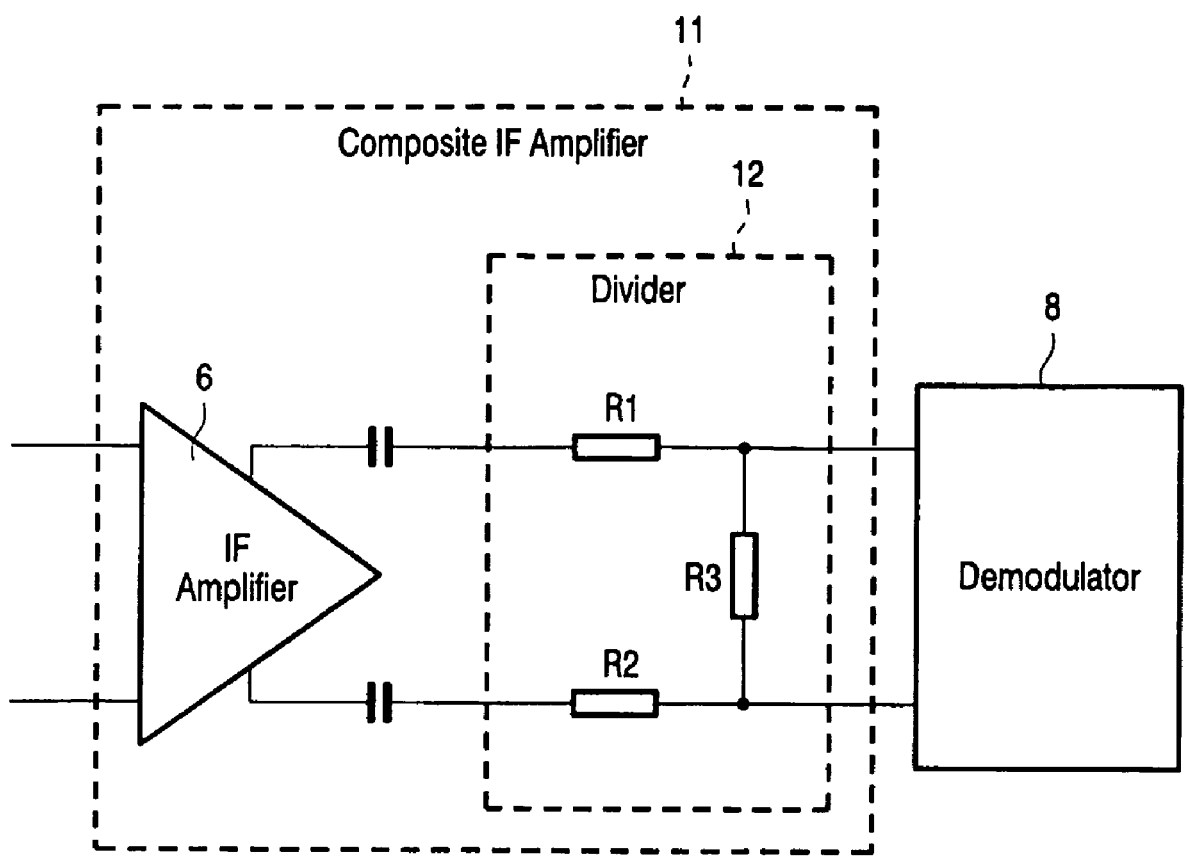

These and other aspects of the invention will be apparent from and elucidated with reference to the embodiments described hereinafter. In the figures show:

FIG. 1: the basic set-up of a state-of-the-art RF receiver,

FIG. 2: diagrams explaining the functionality of the AGC loops of the tuner and IF amplifier in a state-of-the-art RF receiver, FIG. 3: the set-up of an RF receiver according to a preferred embodiment of the present invention, and FIG. 4: a preferred embodiment of the divider according to the present invention.

FIG. 3 depicts the set-up of an RF receiver according to a preferred embodiment of the present invention. In comparison to the state-of-the-art set-up shown in FIG. 1, FIG. 3 comprises a composite IF amplifier 11. The composite IF amplifier is composed of the state-of-the-art IF amplifier 6, which is gain controlled by the AGC loop 9, and a divider 12. The narrowband IF signal 5 is thus amplified by the amplifier 6 with a gain factor $A2$, then the signal level of the output signal of the IF amplifier 6 is multiplied by a factor $A3 \leq 1$ by means of the divider 12 yielding the amplified narrowband IF signal 7, which then is fed into the demodulator 8. Note that the noise figure of the IF amplifier 6 decreases with increasing gain of the amplifier as dictated by the AGC loop 9, whereas the noise level of the signal as output from the IF amplifier 6 is reduced by the divider 12 by the same factor $A3$ as the signal level of said signal, because the divider 12 represents a passive element. The composite IF amplifier 11 is characterised by an effective gain and an effective noise figure. Due to the fact that the noise figure of an amplifier such as IF amplifier 6 generally decreases with increasing amplifier gain, it becomes possible to operate the composite IF amplifier 1 in operating points where it achieves the same effective gain as a stand-alone amplifier, but a smaller effective noise figure than the stand-alone amplifier. This effect will be explained by means of the following example: Consider a stand alone IF amplifier 6 with gain $A2$ and noise figure $NF2$. This stand-alone amplifier is to be replaced with a composite IF amplifier 11, which is desired to have the same effective gain $A=A2$. The composite IF amplifier comprises the divider 12 which is characterised by gain $A3 \leq 1$ and noise figure $NF3=1/A3$. To achieve an effective gain of the composite IF amplifier 11 of A=A2 (equaling that of the stand-alone IF amplifier), the gain of the IF amplifier 6 has to be increased to A2'=A2*(1/A3), which leads to a new noise figure of the IF amplifier 11 denoted as NF2'. According to the chain noise rule, the effective noise figure of the composite IF amplifier 11 then is calculated as:

$$NF=1+(NF2'-1)+(NF3-1)/A2'=NF2'+(NF3-1)/A2'=NF2'+(1/A2)-(1/A2').$$

Thus for larger gain factors A2'>A2>>1, the effective noise figure of the composite IF amplifier 11 can be approximated as NF≈NF2' and only depends on the new noise figure NF2' of the IF amplifier 6, which is operated with larger gain, so that NF2'<NF2 holds. Thus, although the effective gain of the composite IF amplifier 11 is basically the same as that of a comparable stand alone IF amplifier, the effective noise figure is substantially reduced.

However, note that the maximum achievable effective gain of the composite IF amplifier 11, as compared to a stand-alone amplifier, is reduced according to the factor A3 applied by the divider.

The AGC loops 10 and 9 in FIG. 3 are still operated to ensure a constant level of the amplified narrowband IF signal 7 at the input of the demodulator. The gain of the tuner, controlled by the AGC loop 10, is kept maximum as long as possible, where the maximum value of the gain varies due to the tuning frequency and the manufacturing process. To keep the signal level of the amplified narrowband IF signal 7 constant even for increasing signal levels of the RF signal 1, the AGC loop 9 of the IF amplifier 6 reduces the gain of the IF amplifier 6 accordingly. The variation of the maximum gain of the tuner, which may amount several dB, has to be compensated by the IF amplifier 6 as well. However, by incorporating the divider 12 behind the IF amplifier 6, the operating point of the IF amplifier 6 can be shifted without altering the effective gain of the composite IF amplifier 11. If the amplifier chain was specified so that a maximum target chain gain can be achieved even if the maximum gain of the tuner 2 takes its minimum value, any exceeding of the maximum gain of the tuner 2 beyond this minimum value has to be compensated by the IF amplifier 6 by reducing its gain, which increases the noise figure of the IF amplifier 6 and deteriorates the SNR of the amplified narrowband IF signal 7. The divider 12 inherently reduces the gain of the composite IF amplifier 11 by a constant factor, so that the IF amplifier 6 within the composite IF amplifier 12 still can operate at a higher gain (and a lower noise figure). Thus the SNR degradation of the composite IF amplifier 11 is significantly smaller than that of a stand-alone IF amplifier 6 as known from prior art. The price to be paid for the reduced SNR degradation is a reduced maximum effective gain of the composite IF amplifier 11 due to the divider's factor. If the maximum gain o f the tuner 2 takes its minimum value, the effective gain may not suffice to force the signal level of the amplified narrowband IF signal 7 to the constant value required by the demodulator 8. However, it is noticed that the demodulator 8 is rather insensitive to degradations of its input signal level, e.g. up to 2 dB, as long as the SNR remains unchanged. Thus the reduction of the maximum effective gain of the composite IF amplifier 11 does not significantly influence the performance of the amplifier chain as proposed by this invention.

FIG. 4 depicts a preferred embodiment of a divider to be used in the RF receiver according to the preferred embodiment of the present invention (cf. FIG. 3). Most of the IF amplifiers have differential inputs and outputs, so that a divider can be implemented as simple voltage divider with resistors $R_1$, $R_2$ and $R_3$. The values of the resistors can be chosen to define the factor of the divider and depend on the output load of the used IF amplifier. E.g., if $R_1=R_2$ holds, the factor of the divider is given as $R_1/(R_1+0.5\ R_3)$.

In the following, simulation results that compare the sensitivity of an RF receiver according to the preferred embodiment of the invention (denoted as "new RF receiver", cf. FIG. 3) to a state-of-the-art RF receiver (cf. FIG. 1) are presented to indicate the superior performance of the new RF receiver.

The simulation parameters were selected as follows: The tuner noise figure was about 10 dB and the maximum gain of the tuner was close to 49 dB. The SNR of the RF signal was 34.5 dB and the demodulator bandwidth amounted 100 MHz. The signal level in dB μV of the narrowband IF signals 5 at the input of the IF amplifier 6 is given in the first column of the following tabular. The second and third columns indicate the sensitivity of the RF receiver in dB μV, i.e. the minimum signal level of the RF signal 1 for which quasi error-free demodulation of the RF signals was possible. The fourth column finally present the difference between the second and the third column in dB, i.e. indicating the increase in sensitivity that is achieved by using the new RF receiver instead of the state-of-the-art RF receiver.

| IF amplifier input level (dB μV) | State-of-the-art RF receiver sensitivity (dB μV) | New RF receiver sensitivity (dB μV) | Sensitivity gain |
|---|---|---|---|
| 72 | 50.9 | 48.0 | 2.9 dB |
| 76 | 49.0 | 47.9 | 1.1 dB |
| 80 | 48.1 | 47.6 | 0.5 dB |

As is clearly visible, gains in the sensitivity of several dB are possible with the new RF receiver, where the gains are largest for small IF amplifier input levels.

Performing the same simulations with a smaller demodulator bandwidth, namely 55 MHz, produces the results in the following table:

| IF amplifier input level (dB μV) | State-of-the-art RF receiver sensitivity (dB μV) | New RF receiver sensitivity (dB μV) | Sensitivity gain |
|---|---|---|---|
| 72 | 49.1 | 47.9 | 1.2 dB |
| 76 | 48.1 | 47.8 | 0.3 dB |
| 80 | 47.7 | 47.5 | 0.2 dB |

Still the new RF receiver achieves significant gains over the state-of-the-art RF receiver, but due to the reduced demodulator bandwidth (and the reduced amount of "out-of-channel" noise at its input, the sensitivity gain is less pronounced.

If in addition to the reduced demodulator bandwidth of 55 MHz, a tuner with a lower noise figure of 9 dB is used, the simulation results are as follows:

| IF amplifier input level (dB μV) | State-of-the-art RF receiver sensitivity (dB μV) | New RF receiver sensitivity (dB μV) | Sensitivity gain |
|---|---|---|---|
| 72 | 47.9 | 46.5 | 1.4 dB |
| 76 | 47.0 | 46.4 | 0.6 dB |
| 80 | 46.7 | 46.3 | 0.3 dB |

Obviously the sensitivity gains are further increased if a better tuner is used.

Finally, to work out the improvements of the new RF receiver compared to the state-of-the-art RF receiver especially for a varying maximum gain of the tuner in the range [41 dB, 49 dB], the IF amplifier input level was fixed to 76 dB μV, the demodulator bandwidth was 55 MHz, the tuner noise figure was 9 dB and the SNR of the RF signal 1 amounted 34.5 dB. The simulated results are presented in the following tabular, where the second row contains the results of the state-of-the-art RF receiver for varying tuner gains of 41 (second column) and 49 dB (third column) and the difference in the sensitivity of both tuner gains (fourth column), and the third row contains the corresponding results for the new RF receiver:

| IF amplifier input level (dB μV) | Tuner gain 41 dB | Tuner gain 49 dB | Sensitivity difference |
|---|---|---|---|
| State-of-the-art RF receiver sensitivity (dB μV) | 48.3 | 47.0 | 1.3 dB |
| New RF receiver sensitivity (dB μV) | 46.7 | 46.4 | 0.3 dB |

The incorporation of the divider in the new RF receiver obviously reduces the difference in sensitivity encountered when the maximum gain of the tuner varies.

As these simulation results from a preferred embodiment of the invention in the field of RF signal reception have shown, the invention holds the potential for significantly increasing the sensitivity of a chain of amplifiers that suffers from gain factor variations.

The invention claimed is:

1. Method for increasing the sensitivity of a chain of amplifiers that comprises the steps of: amplifying a signal by means of a first amplifier with a gain factor $A_1=A_{1,m}*\Delta A_1$, where $A_{1,m}$ denotes a constant gain factor and $\Delta A_1$ denotes a gain factor variation with $1 \leq \Delta A_{1,min} \leq \Delta A_1 \leq \Delta A_{1,max}$, further amplifying the signal by means of a second amplifier with a controllable gain factor $A_2 \leq A_{2,max}$, where variations $\Delta A_1$ of the gain of the first amplifier are compensated by reducing the gain $A_2$ of the second amplifier, so that the difference between the chain gain factor $A_C=A_1*A_2$ and a target chain gain factor $A_T \leq A_{T,max}$ becomes zero, characterised in that the signal at the output of the second amplifier is additionally fed into a divider that applies a fixed factor $A_3 \leq 1$ to its input, that variations $\Delta A_1$ of the gain factor $A_1$ of the first amplifier as well as the fixed factor $A_3$ are at least partially compensated by the gain factor $A_2$ of the second amplifier, so that the difference between the chain gain factor $A_C'=A_1*A_2*A_3$ and the target chain gain factor $A_T$ becomes minimum, and that the fixed factor $A_3$ is chosen so that there exist at least some combinations of values $\Delta A_1$ and $A_T$ for which said difference can be forced to zero, and some combinations of values $\Delta A_1$ and $A_T$, for which said difference can no longer be forced to zero due to the limitation $A_2 \leq A_{2,max}$.

2. Method according to claim 1, characterised in that said factor $A_3$ is chosen so that said difference can be forced to zero for large values of the variation $\Delta A_1$ and/or small values $A_T$, and that said difference can no longer be forced to zero for small values of the variation $\Delta A_1$ and/or large values $A_T$.

3. Method according to claim 1, characterised in said fixed factor $A_3$ is further chosen so that for a group of target chain gain factors $A_T$, the second amplifier works with a gain factor $A_2$ that is close to its maximum gain factor $A_{2,max}$, that for these target chain gain factors, the greatest possible independence of the gain factor $A_2$ from the variation $\Delta A_1$ is achieved and that a difference between the chain gain factor $A_C'$ and the target chain gain factor $A_T$ is accepted especially for smaller values of $\Delta A_1$.

4. Method according to claim 3, characterised in that group of target chain gain factors $A_T$ are the most frequently occurring target chain gain factors.

5. Method according to claim 1, characterised in that the gain factor $A_1$ defines the product between the maximum gain factor of a tuner that down-converts a modulated Radio Frequency (RF) signal to a broadband Intermediate Frequency (IF) signal and the gain factor of an IF filter that transforms the broadband IF signal into a narrowband IF signal, where the gain factor of the IF filter is fixed and the maximum gain factor of the tuner varies, and that the gain factor $A_2$ represents the gain factor of an IF amplifier that amplifies the narrowband IF signal to produce an amplified narrowband IF signal that is fed into a demodulation instance to produce a demodulated signal.

6. Method according to claim 5, characterised in that said at least partial compensation of said variations $\Delta A_1$ of the gain factor of the first amplifier as well as of said fixed factor $A_3$ of the divider by controlling the gain factor $A_2$ of the second amplifier to achieve a minimum difference between the chain gain factor $A_C'=A_1*A_2*A_3$ and the target chain gain factor $A_T$ represents a part of one out of the two steps of a joint control of the gains of the tuner and the IF amplifier, which is performed in order to force the signal level of the amplified narrowband IF signal at the input of the demodulator to a constant target value, where for steadily increasing RF signal levels said two steps are defined as: a first step of keeping the gain factor of the tuner at its maximum value and varying the gain factor of the IF amplifier so that the difference between the chain gain factor $A_C'=A_1*A_2*A_3$ and the target chain gain factor $A_T$, which steadily reduces with the steadily increasing RF signal levels, becomes minimum, until the broadband IF signal exceeds a dedicated dynamic range at a take-over point, and a second step of not further reducing the gain factor $A_2$ from said take-over point on and starting to steadily reduce the gain factor of the tuner below its maximum value instead.

7. Method according to claim 6, characterised in that for said combinations of values $\Delta A_1$ and $A_T$, for which said difference between the chain gain factor $A_C'$ and the target chain gain factor $A_T$ can no longer be forced to zero due to the limitation $A_2 \leq A_{2,max}$ and the signal level of the amplified narrowband IF signal at the input of the demodulator falls below the constant target value accordingly, the degradation of the quality of the demodulated signal compared to the case when said difference can be forced to zero is insignificant.

8. Device for increasing the sensitivity of a chain of amplifiers, comprising: a first amplifier for amplifying a signal by a gain factor $A_1=A_{1,m}*\Delta A_1$, where $A_{1,m}$ denotes a fixed gain factor and $\Delta A_1$ denotes a gain factor variation with $1 \leq \Delta A_{1,min} \leq \Delta A_1 \leq \Delta A_{1,max}$, a second amplifier for further amplifying the signal by a controllable gain factor $A_2 \leq A_{2,max}$, where the second amplifier compensates the variations $\Delta A_1$ of the gain of the first amplifier, so that the difference between the chain gain factor $A_C=A_1*A_2$ and a target chain gain factor $A_T \leq A_{T,max}$ becomes zero, characterised in that the device further comprises a divider that is arranged behind the second amplifier and applies a fixed factor $A_3 \leq 1$ to its input, where the second amplifier at least partially compensates the variations $\Delta A_1$ of the gain factor $A_1$ of the first amplifier as well as the fixed factor $A_3$, so that the difference between the chain gain factor $A_C'=A_1*A_2*A_3$ and the target chain gain factor $A_T$ becomes minimum, and where the fixed factor $A_3$ is chosen so that there exist at least some combinations of values $\Delta A_1$ and $A_T$ for which said difference can be forced to zero, and some combinations of values $\Delta A_1$ and $\Delta_T$, for which said difference can no longer be forced to zero due to the limitation $A_2 \leqq A_{2,max}$.

9. Device according to claim 8, characterised in that the first amplifier represents both a tuner that down-converts a modulated Radio Frequency (RF) signal to a broadband Intermediate Frequency (IF) signal and an IF filter that transforms the broadband IF signal into a narrowband IF signal, where the gain factor of the IF filter is fixed and the maximum gain factor of the tuner varies due to the manufacturing process, and that the second amplifier represents an IF amplifier that amplifies the narrowband IF signal to produce an amplified narrowband IF signal that is fed into a demodulation instance to produce a demodulated signal.

10. Device according to claim 8, characterised in that said divider is a voltage divider.

* * * * *